(12) United States Patent
Saitou (10) Patent No.: US 10,378,102 B2
(45) Date of Patent: Aug. 13, 2019

(54) ROTARY CATHODE UNIT FOR MAGNETRON SPUTTERING APPARATUS

(71) Applicant: ULVAC, INC., Kanagawa (JP)

(72) Inventor: Shuuji Saitou, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 15/552,079

(22) PCT Filed: Jan. 8, 2016

(86) PCT No.: PCT/JP2016/000092
§ 371 (c)(1),
(2) Date: Aug. 18, 2017

(87) PCT Pub. No.: WO2016/136121
PCT Pub. Date: Sep. 1, 2016

(65) Prior Publication Data
US 2018/0030591 A1 Feb. 1, 2018

(30) Foreign Application Priority Data
Feb. 24, 2015 (JP) ................................. 2015-034206

(51) Int. Cl.
*C23C 14/34* (2006.01)
*C23C 14/35* (2006.01)
*H01J 37/34* (2006.01)

(52) U.S. Cl.
CPC ........ *C23C 14/355* (2013.01); *C23C 14/3407* (2013.01); *C23C 14/35* (2013.01);
(Continued)

(58) Field of Classification Search
CPC .. C23C 14/3492; H01J 37/342; H01J 37/3455
See application file for complete search history.

(56) References Cited

U.S. PATENT DOCUMENTS 4,356,073 A * 10/1982 McKelvey .......... H01J 37/3405
204/192.12
2006/0000705 A1 1/2006 Hartig et al.
(Continued)

FOREIGN PATENT DOCUMENTS

CN 1978689 A 6/2007
CN 101812667 A 8/2010
(Continued)

OTHER PUBLICATIONS

International Search Report and Written Opinion for PCT Patent App. No. PCT/JP2016/000092 (dated Apr. 12, 2016) with English language translation of the ISR.
(Continued)

*Primary Examiner* — Jason Berman
(74) *Attorney, Agent, or Firm* — Cermak Nakajima & McGowan LLP; Tomoko Nakajima (57) ABSTRACT

A magnet unit Mu is disposed inside a target of a cylindrical shape and generates a magnetic field that leaks from a surface of the target such that a line passing through a position in which a vertical component of the magnetic field becomes zero extends along a generating line of the target so as to close like a racetrack shape. The magnet unit is constituted into separate parts of: a first part which respectively forms a corner portion of the racetrack shape at both ends, in the direction of the generating line, of the target; a second part which is respectively disposed on the inside, as seen in the direction of the generating line, of the target, adjacent to the first part; and a third part which is positioned between the second parts.

7 Claims, 4 Drawing Sheets

(52) U.S. Cl.
CPC ........ *H01J 37/342* (2013.01); *H01J 37/3405* (2013.01); *H01J 37/3452* (2013.01); *H01J 37/3455* (2013.01); *H01J 37/3497* (2013.01)

(56) References Cited

U.S. PATENT DOCUMENTS

| | | | |
|---|---|---|---|
| 2008/0047831 A1* | 2/2008 | Richert | C23C 14/3407 |
| | | | 204/298.12 |
| 2012/0261253 A1 | 10/2012 | Madocks et al. | |
| 2014/0097080 A1* | 4/2014 | Heinrich | C23C 14/35 |
| | | | 204/192.13 |
| 2014/0246312 A1* | 9/2014 | Crowley | H01J 37/3444 |
| | | | 204/298.08 |

FOREIGN PATENT DOCUMENTS

| | | |
|---|---|---|
| JP | 55-9634 Y2 | 3/1980 |
| JP | 2008-505250 A | 2/2008 |
| JP | 2012-132039 A | 7/2012 |
| JP | 2012132039 A | 7/2012 |
| JP | 2013-508565 A | 3/2013 |
| WO | WO2006/007504 A1 | 1/2006 |
| WO | WO2011/056581 A2 | 5/2011 |

OTHER PUBLICATIONS

Office Action from Chinese Patent App. No. 2016800120477 (dated Nov. 2, 2018).

\* cited by examiner

ROTARY CATHODE UNIT FOR MAGNETRON SPUTTERING APPARATUS

This application is a national phase entry under 35 U.S.C. § 371 of PCT Patent Application No. PCT/JP2016/000092, filed on Jan. 8, 2016, which claims priority under 35 U.S.C. § 119 to Japanese Patent Application No. 2015-034206, filed Feb. 24, 2015, both of which are incorporated by reference.

TECHNICAL FIELD

The present invention relates to a rotary cathode unit that is used in a magnetron sputtering apparatus.

BACKGROUND ART

This kind of rotary cathode unit is known, e.g., in Patent Document 1. This conventional example has: a cylindrical target which is disposed to lie opposite to a substrate inside a vacuum chamber; a magnet unit which is disposed in an inner space of the target; a cooling medium circulation means for circulating a cooling medium in the inner space of the target; and a driving means for driving the target to rotate. As the magnet unit there is used one having on one surface of a yoke made of a magnetic material and having a length equivalent to a generating line of the target: a central magnet which is disposed to extend along the generating line of the target; peripheral magnets which are disposed on both sides of the central magnet so as to be extended along the central magnet; and corner magnets which bridge the peripheral magnets in a manner to enclose both ends of the central magnet. In this arrangement, the polarity on the side of the substrate relative to the central magnets and to the peripheral magnets and the corner magnets is switched to generate a magnetic field leaking from the surface of the target so that a line to pass through a position in which the vertical composition of magnetic field becomes zero is extended along the generating line of the target, between the target and the substrate, thereby closing like a race-track shape. Further, in the inner space of the target, there is disposed a moving means for integrally moving the magnet unit toward, and away from, the target.

In case the target is sputtered while rotating the target by using the above-mentioned rotary cathode unit, plasma will be generated along the race-track shaped line. Along this line the electrons in the plasma will be moved clockwise or counter-clockwise depending on the polarity of the substrate relative to the central magnets and to the peripheral magnets and the corner magnets. At this time, the electron density is likely to become locally high at the corner portions of the race-track. In this case, as long as the erosion of the target along the generating line of the target is concerned, the amount of erosion on those both sides of the target which respectively lie opposite to the corner portions becomes larger than the amount of erosion at the central portion of the target. A disadvantage occurs in that the target utilization efficiency is remarkably deteriorated.

As a method of eliminating this kind of disadvantage, it is conceivable to change the space between the target and the magnet unit to thereby change the intensity of the magnetic field that leaks from the surface of the target. However, it is impossible to restrain the local erosion at both end portions of the target simply by integrally moving the magnet unit, toward and away from the target, as in the above-mentioned conventional example. On the other hand, it is conceivable to locally weaken, at those corner portions of the magnet unit which give rise to local erosion of the target, the intensity of the magnetic field that leaks from the surface of the target by changing, e.g., the kind of magnet, the arrangement of magnets. However, although the local erosion of the target at the end portions of the target may be restrained by weakening the magnetic field, it has been found that the amount of erosion changes at that portion of the target which is positioned from these end portions toward the inside in the direction of the generating line.

PRIOR ART DOCUMENT

Patent Document

Patent document 1: JP-A-2012-132039

SUMMARY OF THE INVENTION

Problems to Be Solved by the Invention

In view of the above points, this invention has a problem of providing a rotary cathode unit for magnetron sputtering apparatus having a higher percentage of target utilization in which the target is arranged to get eroded uniformly over the entire length, as seen in the direction of the generating line, of the target.

Means for Solving the Problems

In order to solve the above problem, the rotary cathode unit for a magnetron sputtering apparatus according to this invention comprises: a cylindrical target; a magnet unit disposed in an inner space of the target, the magnet unit generating a magnetic field that leaks from a target surface such that a line passing through a position in which a vertical component of the magnetic field becomes zero extends along a generating line of the target so as to close like a racetrack shape; coolant circulation means for circulating a coolant through the inner space of the target; and driving means for driving the target to rotate. The magnet unit is constituted by: a first part which respectively forms a corner portion of the racetrack shape at both ends, as seen in the direction of the generating line, of the target; a second part which is respectively disposed on the inside, as seen in the direction of the generating line, of the target, adjacent to the first part; a third part which is positioned between the second parts; and a moving means for moving the first part and the second part independent of each other toward and away from the surface of the target. The moving means is housed in the inner space of the target.

According to this invention, in case the electron density in the plasma generated in the racetrack shape becomes locally high at the corner portions thereof and, as a result, the amount of erosion at both ends of the target increases, both of the first parts can be moved relative to the target away from each other, by the moving means housed in the inner space of the target. In this manner, the intensity of the magnetic field to be leaked from the surface of the target can be weakened to thereby restrain the local erosion at both end portions of the target. And, in case the amount of erosion changes at the target portions that are respectively positioned on the inner side, as seen in the direction of the generating line, of the target, by changing the magnetic field strength at the corner portions, both of the second parts can be moved toward or away from the target by the moving means. In this manner, the intensity of the magnetic field at the parts in question can be changed. The amount of erosion of the target can thus be adjusted. As a result, it becomes possible to erode the target uniformly over the entire length of the generating line of the target. The percentage of target utilization can be improved.

In this invention, rotary cathode unit for a magnetron sputtering apparatus preferably further comprises still another moving means for moving the third part of the magnet unit independently toward and away from the surface of the target. According to this arrangement, depending on the kind of the target and the thickness of the target, the intensity of the magnetic field that leaks from the surface of the target can be changed accordingly. In addition, when the erosion of the target has progressed, the intensity of the magnetic field can be changed so that the intensity of the magnetic field that leaks from the surface of the target becomes constant. As a result, when the rotary cathode unit according to this invention is applied to a magnetron sputtering apparatus, it becomes possible to form a predetermined thin film on the surface of the substrate with good reproducibility.

BRIEF DESCRIPTION OF THE DRAWINGS

FIGS. 4(a) and 4(b) are sectional views taken along the line IV-IV in FIG. 1, wherein FIG. 4(a) shows a state in which the magnet unit is made close to a target and FIG. 4(b) shows a state in which the magnet unit is made away from the target.

MODES FOR CARRYING OUT THE INVENTION

With reference to the drawings a description will now be made of an embodiment of a rotary cathode unit for a magnetron sputtering apparatus of this invention. In the following, the terms such as "upper", "lower", "right" and "left" are used with reference to a standard of the posture of the rotary cathode unit for a magnetron sputtering apparatus as shown in FIG. 1.

Figure 1:
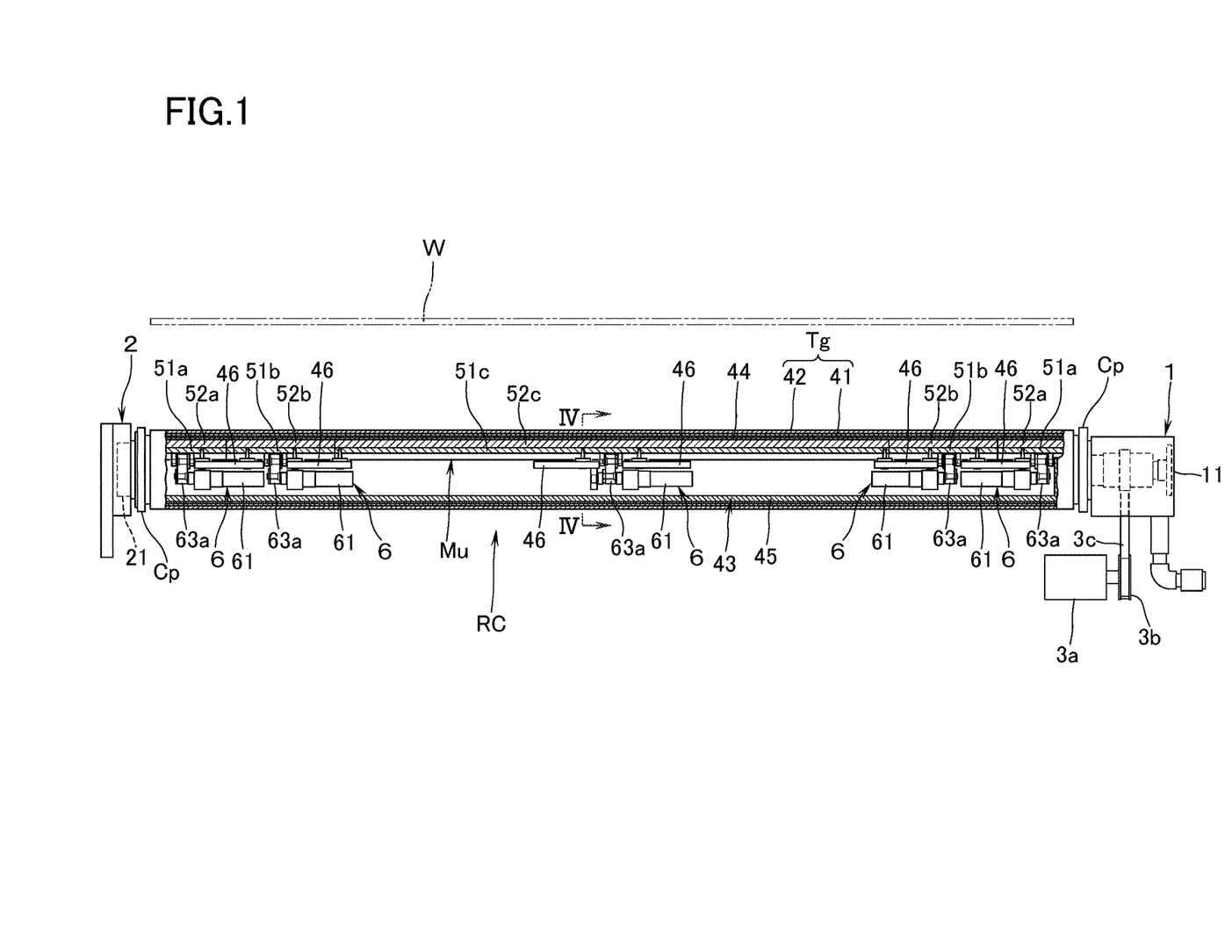
FIG. 1 is a front view, partly shown in section, to explain an arrangement of a rotary cathode unit according to an embodiment of this invention.
Figure 2:
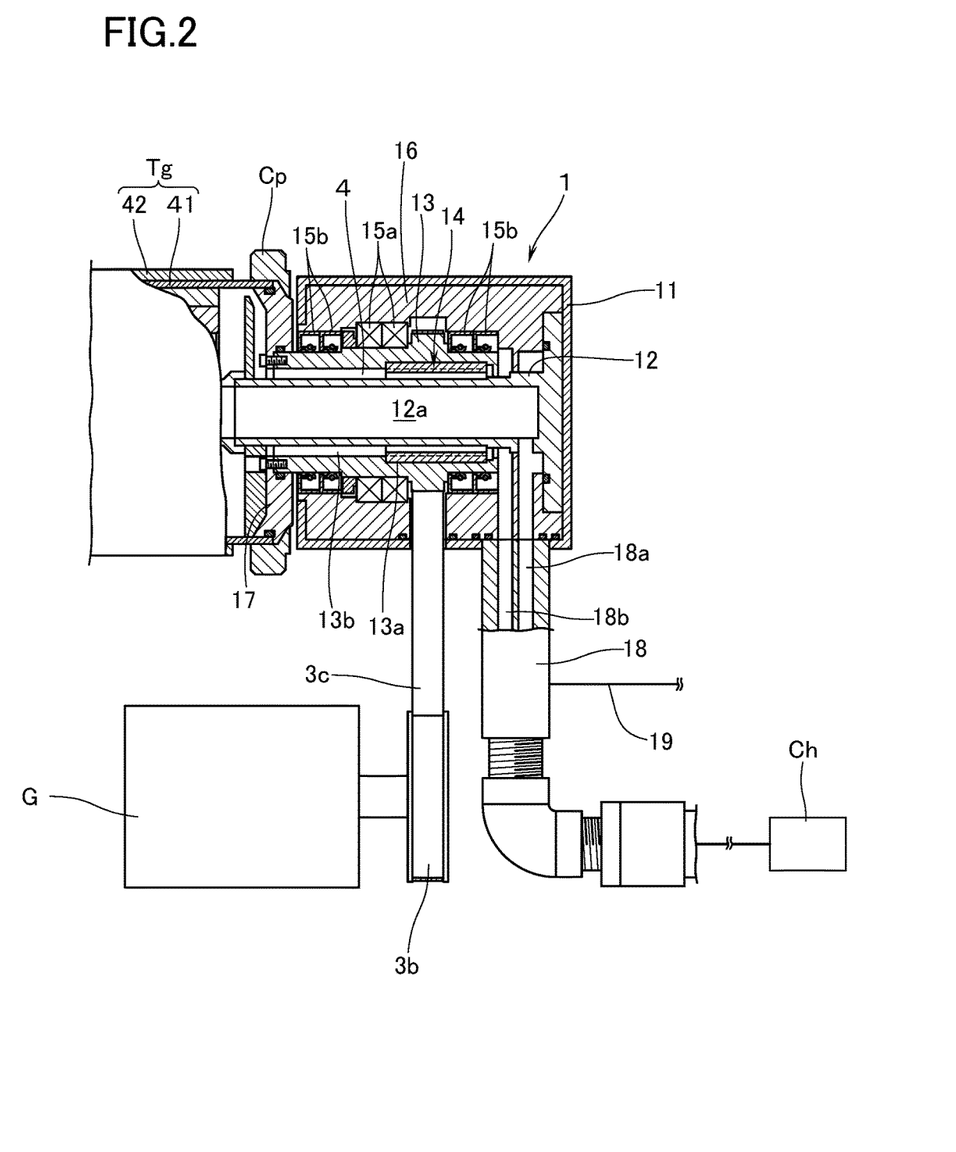
FIG. 2 is a sectional view to explain an arrangement of a driving block.

With reference to FIGS. 1 and 2, the reference mark RC denotes a rotary cathode unit according to this embodiment. The rotary cathode unit RC is disposed in a vacuum chamber (not illustrated) through an insulating material in a manner to lie opposite, in an upper and lower direction, to a substrate W which is an object on which a thin film is to be formed. The rotary cathode unit RC is constituted by: a cylindrical target Tg; a driving block 1 which is connected to the right end of the target Tg through a clamp Cp; and a supporting block 2 which is connected to the left end of the target Tg. The supporting block 2 is provided with a driven shaft 21 rotatably supported by a bearing (not illustrated) so that one end of the target Tg can be supported in a rotatable manner.

The driving block 1 is provided with a housing 11 as shown in FIG. 2. The right inner wall of the housing 11 is provided, in a manner to be elongated in the left and right direction, with an inner cylinder body 12 which is circular in section. In the circumference of the inner cylinder body 12 that is fixed to the housing 11, there is disposed an outer cylinder body 13 which is circular in section in a manner coaxial with the inner cylinder body 12. On an inner peripheral surface of the outer cylinder body 13, there is provided an annular recessed portion 13a which is dented in a diametrically inner direction. Through this recessed portion 13a, there are provided brushes 14 which communicate the inner cylinder body 12 and the outer cylinder body 13. The outer cylinder body 13 is rotatably supported by a supporting member 16 which is inserted into an inside of the housing 11 through a plurality of bearings 15a. In FIG. 2 the reference marks 15b denote oil seals.

On a peripheral surface of the outer cylinder body 13 there is wound a belt 3c over a pulley 3b that is disposed on a driving shaft of the motor 3a. On the left end of the outer cylinder body 13, an electrically conductive flange 17 is mounted in a fluid-tight manner, and through this flange 17 the outer cylinder body 13 is connected to a backing tube 41 of the target Tg. According to this arrangement, when the motor 3a is driven to rotate the outer cylinder body 13, the target Tg is driven for rotation integrally with the outer cylinder body 13 at a predetermined rotational speed. In this case, the motor 3a, the belt 3c and the outer cylinder body 13 constitute driving means of this embodiment. Further, the inner cylinder body 12 is in electrical conduction, through the brushes 14, with the outer cylinder body 13. This outer cylinder body 13 is further in electrical conduction with the target material Tg (in other words, the inner cylinder body 12 and the target material 42 are at the same potential).

The housing 11 is provided with conductive piping 18 having inside thereof an incoming passage 18a and a return passage 18b, respectively. One end of the piping 18 passes through the housing 11 to extend up to the inner cylinder body 12. As a result, the incoming passage 18a comes into fluid-flow communication with the inner space 12a of the inner cylinder body 12, and the return passage 18b is in fluid-flow communication with the space 13b between the inner cylinder body 12 and the outer cylinder body 13. The other end of the piping 18 is connected to a chiller unit Ch which serves as coolant circulation means having a known construction. Further, the piping 18 has connected thereto an output cable 19 from a sputtering power supply (not illustrated). According to this arrangement, while the outer cylinder body 13 is driven for rotation by the motor 3a, a predetermined power, e.g., with negative potential can be charged to the target Tg through the output cable 19 from the sputtering power supply.

Figure 3:
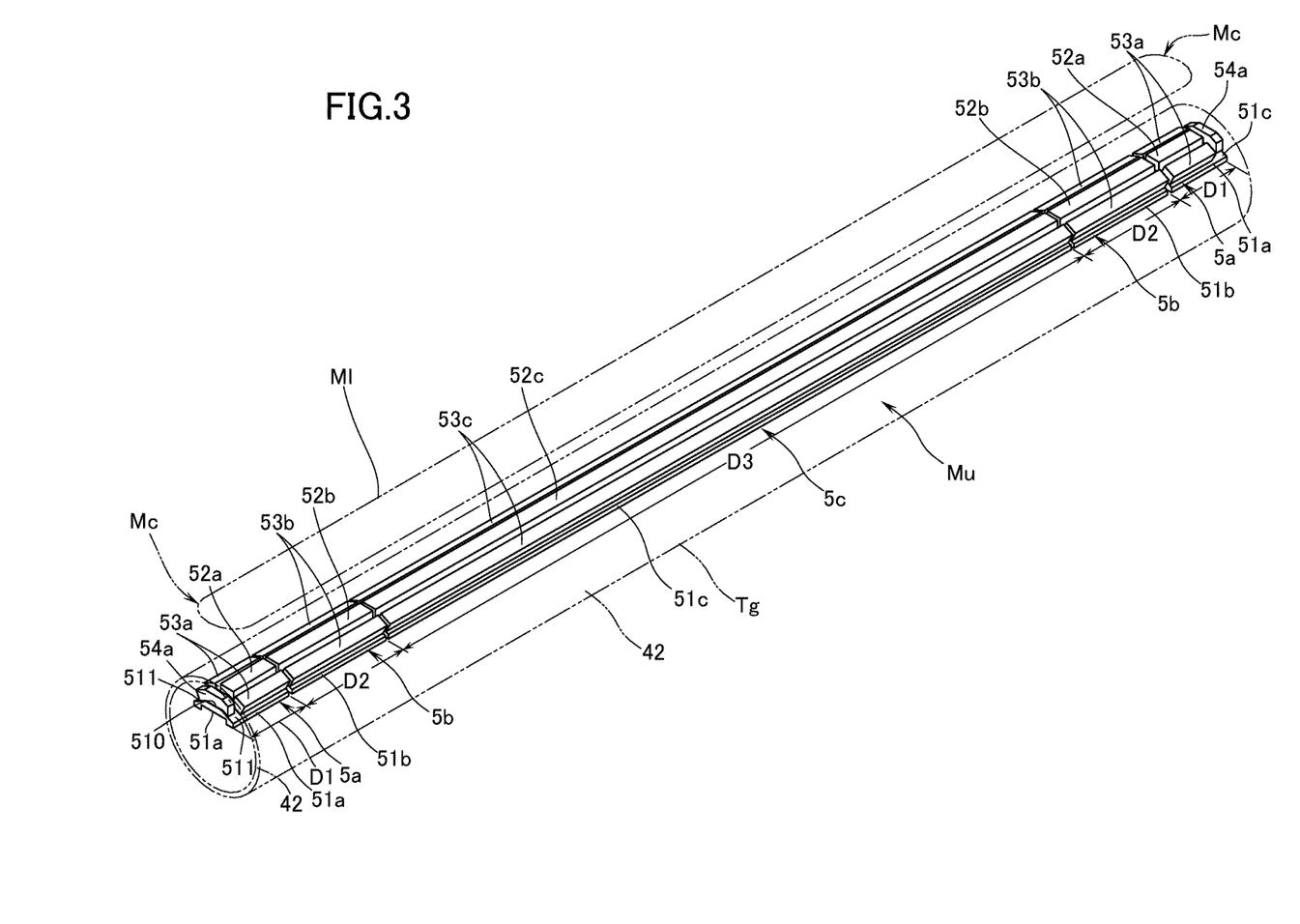
FIG. 3 is a perspective view to explain a magnet unit.

The target Tg is constituted by a cylindrical backing tube 41, and a cylindrical target material 42 which is bonded to the backing tube 41 with a bonding material (not illustrated) such as indium, tin and the like. As the target material 42, there may be used one which is appropriately selected from metals or metallic compounds depending on the composition of the film to be formed on the substrate W. Inside the backing tube 41, there is disposed by insertion into a thin-walled magnet case 43 which extends over the entire length as seen in the direction of the generating line of the target material 42. Then, as shown in FIG. 3, inside the magnet case 43, there is built therein a magnet unit Mu which generates a magnetic field leaking from the surface of the target Tg such that the line Ml passing through the position at which the vertical component of the magnetic field becomes zero is extended, between the target Tg and the substrate W, along the generating line of the target Tg so as to close like a racetrack shape.

Here, in case the target material 42 is sputtered while rotating the target Tg, plasma will be generated along the racetrack-shaped line Ml, and the electrons in the plasma will move along the line clockwise or counterclockwise. At the corner portions Mc, however, the electron density is likely to become locally high. Therefore, it is necessary to arrange the magnet unit Mu such that the target material 42 does not get eroded locally at those both ends of the target material 42 which lie opposite to the corner portions Mc but the target Tg gets eroded uniformly over the entire length as seen in the direction of the generating line of the target Tg.

Figure 4A:
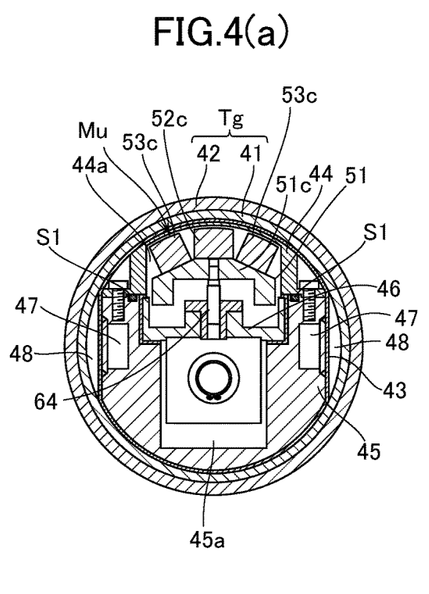
Figure 4B:
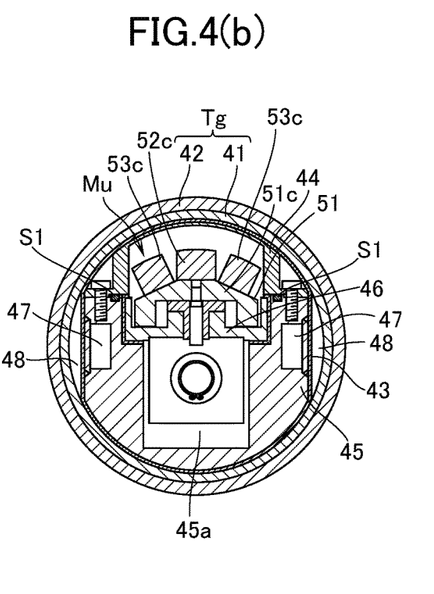

In this embodiment, the magnet unit Mu is separately constituted by: first parts 5a which respectively form a corner portion Mc at both ends, as seen in the direction of the generating line, of the target Tg; second parts 5b, of a predetermined length, which are respectively disposed on the inside, as seen in the direction of the generating line, of the target Tg, adjacent to the first part 5a; and a third part 5c which is positioned between both of the second parts 5b. Moving means 6 for moving the first part 5a, the second part 5b and the third part 5c, independent of each other, toward and away from the surface of the target Tg, is housed inside the magnet case 43 in the inner space of the target Tg. The moving means 6 is housed in the magnet case 43 as an inner space of the target Tg. A description will now be made, in concrete, of the internal construction of the magnet case 43 with further reference to FIGS. 4 and 5.

As shown in FIGS. 4(a) and 4(b), the magnet case 43 has inserted thereinto an upper frame body 44 and a lower frame body 45 which are connected together in the up-and-down direction through an O ring S1. The upper frame body 44 and the lower frame body 45 are separated from each other by a partition plate 46. In that inner space 44a of the upper frame body 44 which is positioned above the partition plate 46, the magnet unit Mu is disposed. Further, in that inner space 45a of the lower frame body 45 which is positioned below the partition plate 46, there are disposed five sets of moving means 6 for independently moving the first part 5a, the second part 5b and the third part 5c such that each of the parts is movable toward and away from the surface of the target Tg. On an outer peripheral surface of the lower frame body 45, there is disposed an incoming passage 47 for circulating a cooling medium in a space to the magnet case 43 so as to be elongated in a direction of the generating line of the target Tg. The right end of the incoming passage 47 is in communication with the inner space 12a of the inner cylinder body.

On the other hand, the magnet case 43 is formed so as to have a cross section of an oblong in the up-and-down direction so that, when the magnet case 43 is disposed by insertion into the backing tube 41, a return passage 48 is formed so as to be located diametrically outside the incoming passage 47, between the magnet case 43 and the backing tube 41. This return passage 48 is in communication with the space 13b between the inner cylinder body 12 and the outer cylinder body 13. According to this arrangement, there will be formed a cooling medium circulation passage starting from the chiller unit Ch, from the incoming passage 18a of the piping 18 through the inner space 12a, reaching the incoming passage 47 of the magnet case 43, then returning to the return passage 48 of the magnet case at the end portion of the supporting block 2, reaching the space 13b from this return passage 48, and returning from the return passage 18b of the piping 18 back to the chiller unit Ch. In this arrangement, the target material 42 can be cooled, during sputtering, by heat exchanging with the cooling medium.

Figure 5:
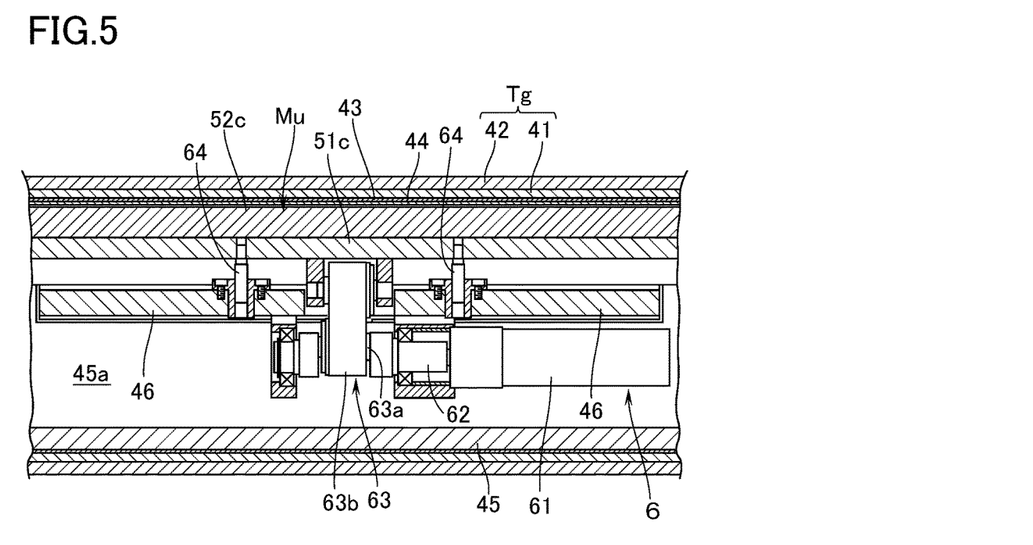
FIG. 5 is an enlarged sectional view to explain a moving means for moving the magnet unit.

Each of the moving means 6 has the same construction and, as shown in FIG. 5, has a motor 61, and a crank mechanism 63 which is coupled to a driving shaft 62 of the motor 61. The crank pin 63a of the crank mechanism 63 has a crank arm 63b which penetrates a through hole (not illustrated) which is formed in a predetermined position of the partition plate 46 and which extends upward, is inserted onto an outside of the crank pin 63a. The upper end of the crank arm 63b is coupled to the lower surface of the yokes 51a, 51b, 51c which will be described hereinafter. According to this arrangement, when the motor 61 is rotated to drive, the magnet unit Mu will move freely in a back-and-forth direction between a close (nearby) position (see FIG. 4(a)) in which the magnet unit Mu comes closer to the target Tg, and an away position (see FIG. 4(b)) in which the magnet unit Mu is away from the target unit Tg. Further, the partition plate 46 positioned in the neighborhood of the crank arm 63b is provided with a guide pin 64 that is projected upward. A front end portion of the guide pin 64 is inserted into the guide holes formed in predetermined positions of the yokes 51a, 51b and 51c that will be described hereinafter.

The first part 5a, the second part 5b and the third part 5c of the magnet unit Mu are disposed in line with each other without clearance in between inside the upper frame body 44 along the generating line of the target Tg. The first part 5a, the second part 5b and the third part 5c are provided with yokes 51a, 51b and 51c of the same sectional shape but of different lengths, and are so arranged that they have the length equivalent to the length of the generating line of the target Tg when they have been arrayed in line with each other along the generating line of the target Tg without clearance in between (see FIG. 3). Each of the yokes 51a, 51b and 51c is constituted by a plate-shaped member made of a magnetic material having formed therein a top face 510 which is in parallel with the substrate W, and inclined faces 511 which are respectively inclined from the top face 510 downward. On the top surface 510 of the yoke 51a in the first part 5a, there is disposed a central magnet 52a in a manner to be elongated from an inner end as seen in the direction of the generating line of the yoke. On both the inclined faces 511 there are respectively disposed peripheral magnets 53a which are equal in length to the central magnet 52a. Then, on an outer end, as seen in the direction of the generating line, of the top surface 510 of the yoke 51a, there is disposed a corner magnet 54 so as to bridge the mutual distances between the peripheral magnets 53a in a manner to enclose the end portions of the central magnet 52a.

Further, on the top surface 510 of each of the yokes 51b, 51c of the respective second parts 5b and the third part 5c, the central magnets 52b, 52c are disposed over the entire length of the top surfaces. Further, both of the inclined surfaces 511 have disposed thereon the peripheral magnets 53b, 53c over the entire length thereof. In this case, as the central magnets 52a, 52b, 52c, the peripheral magnets 53a, 53b, 53c, and the corner magnets 54 and ", neodymium magnets of the same magnetization are used. For example, bar-shaped magnets of substantially square cross-section that are integrally formed may be used or, otherwise, magnet pieces of rectangular parallelepiped may also be arranged side by side with each other. Further, since the inside of the magnet case 43 can be made atmospheric, known adhesives may be used to adhere the peripheral magnets to each of the yokes 51a, 51b, 51c. By the way, it may be so arranged that the magnets in the first parts 5a are different from those in the other parts so that the intensity of the magnetic field leaking on the surface of the target Tg changes from each other.

The length D1, as seen in the direction of the generating line, of the first part 5a is set to correspond to the position serving as the starting point of the corner portion Mc of the line Ml in the race-track shape (i.e., the position at which the line of the race-track shape starts changing from a straight line to a curved line). The length D2 of the second part 5*b* is appropriately set depending on the in-plane film thickness distribution when the target Tg is sputtered under predetermined conditions. Then, the length D3 of the third part 5*c* is appropriately set by taking into consideration the length of the generating line of the target Tg. By the way, in case the length of the magnet unit Mu is changed corresponding to the length of the generating line of the target Tg, the lengths D1, D2 of the first part 5*a* and the second part 5*b* are left as they are, and adjustment is made by changing the length D3 of the third part 5*c*.

According to the above-mentioned arrangement, in case the electron density in the plasma becomes locally higher at the corner portions Mc of the race-track M1 so that the amount of erosion at both ends of the target Tg becomes locally high, the first parts 5*a* of the target Tg are both moved by the moving means 6 in a direction away relative to the target Tg. As a result, the intensity of the magnetic field leaking from the surface of the target Tg is weakened, thereby restraining the local erosion of the target Tg at both end portions thereof. In addition, as a result of weakening the intensity of the magnetic field at the corner portions Mc, the amount of erosion of the target Tg changes at those portions of the target Tg which are positioned respectively inward, as seen in the direction of the generating line, of both end portions of the target Tg. Then, the second parts 5*b* are both moved by the moving means 6 relative to the target Tg in a direction toward, or away from, the target Tg. In this manner, the intensity of the magnetic field at the portions in question can be changed and, accordingly, the amount of erosion of the target Tg can be adjusted. As a consequence, it becomes possible to have the target eroded uniformly over the entire length, as seen in the direction of the generating line, of the target Tg, and a higher percentage of target Tg utilization can be attained. The in-plane film thickness distribution on the substrate when the target Tg according to this embodiment is sputtered to thereby form a film on the substrate, can also be made uniform. Further, since the third part 5*c* is also arranged to be movable toward, and away from, the surface of the target Tg, the intensity of the magnetic field leaking from the surface of the target Tg can accordingly be changed depending on the kind of the target and the thickness of the target. Still furthermore, depending on the progress of erosion of the target Tg, the intensity of the magnetic field leaking from the surface of the target Tg can be changed so that the intensity of the magnetic field leaking from the surface of the target Tg can be made uniform. The result will be that a predetermined thin film can be formed on the surface of the substrate W with good reproducibility.

Descriptions have so far been made of the embodiment of this invention, but this invention shall not be limited to the above. In the above-mentioned embodiment, an explanation has been made of an example in which the third part 5*c* is arranged to be movable toward, and away from, the target Tg, but this may be omitted. In addition, an explanation has been made of an example in which a motor and a crank mechanism are provided as the moving means 6, but other actuators such as a linear motor and the like may also be used. In this case, in order to simplify the arrangement of the apparatus, the actuator shall preferably be capable of positioning each part 5*a*, 5*b*, 5*c* of the magnet unit Mu in an open loop system.

DESCRIPTION OF REFERENCE MARKS

RC cathode unit for magnetron sputtering apparatus
Tg cylindrical target
Mu magnet unit
41 backing tube
42 target material
43 magnet case
Ml line that passes through a position in which vertical component of magnetic field becomes zero
Mc corner portion of race track
5*a* first part of magnet unit
5*b* second part of magnet unit
5*c* third part of magnet unit
6 moving means
Ch chiller unit (coolant circulation means)
47 incoming passage (coolant circulation means)
48 return passage (coolant circulation means)

What is claimed is:

1. A rotary cathode unit for a magnetron sputtering apparatus comprising:
    a cylindrical target;
    a magnet unit disposed in an inner space of the target, the magnet unit generating a magnetic field that leaks from a target surface such that a line passing through a position in which a vertical component of the magnetic field becomes zero extends along a generating line of the target so as to close like a racetrack shape;
    coolant circulation means for circulating a coolant through the inner space of the target;
    and driving means for driving the target to rotate,
    wherein the magnet unit includes
        a pair of first magnets, a pair of second magnets, and a single third magnet which are arranged in a direction of the generating line,
        the pair of first magnets which respectively forms a corner portion of the racetrack shape and each first part being located respectively at both ends, as seen in the direction of the generating line, of the target;
        the pair of second magnets which is respectively disposed on the inside, as seen in the direction of the generating line, of the target, immediately adjacent to the pair of first parts; and
        the single third magnet which is positioned centrally and immediately adjacent to (and between) each second magnet; and,
    wherein each of the pair of first magnets, each of the pair of second magnets, and the single third magnet
        has a yoke underneath respectively, each yoke having a same sectional shape, and
        is divided in a direction perpendicular to the direction of the generating line into central magnets on a top surface of each yoke; and
            peripheral magnets which are substantially equal in length to the central magnets provided in parallel to the central magnets
    wherein the magnet unit includes a first moving means for moving the pair of the first magnet and the pair of the second magnet independent of each other toward and away from the surface of the target, the first moving means being housed in the inner space of the target.

2. The rotary cathode unit for a magnetron sputtering apparatus according to claim 1, further comprising still second moving means for moving the single third magnet of the magnet unit independently toward and away from the surface of the target.

3. The rotary cathode nit for a magnetron sputtering apparatus according to claim 1, further comprising a magnet case disposed by insertion into the inner space of the target, wherein the magnet unit is placed in position inside the magnet case that is kept atmospheric.

4. The rotary cathode unit for a magnetron sputtering apparatus according to claim 3,
wherein the first moving means is housed inside the magnet case, the first moving means being for moving the pair of the first magnets, the pair of the second magnets, and the single third magnet respectively independent of one another toward and away from the surface of the target.

5. The rotary cathode unit for a magnetron sputtering apparatus according to claim 3, the target further comprising: a backing tube; and a target material bonded to an outside surface of the backing tube,
wherein a fluid flow passage of the coolant circulation means is formed between an outer surface of the magnet case and an inner peripheral surface of the backing tube.

6. The rotary cathode unit for a magnetron sputtering apparatus according to claim 3, the first moving means comprising: a motor; and a crank mechanism coupled to a driving shaft of the motor,
wherein the first moving means is coupled to the magnet unit through a crank arm of the crank mechanism so that, by driving the motor to rotate, the magnet unit is movable toward and away from the target.

7. The rotary cathode unit for a magnetron sputtering apparatus according to claim 1, wherein the single third magnet of the magnet unit has a different length in the direction of generating line from either the pair of first magnets and the pair of second magnets.

* * * * *